United States Patent
Chen

(10) Patent No.: US 11,398,824 B2
(45) Date of Patent: Jul. 26, 2022

(54) DELAY LOCKED LOOP CIRCUIT

(71) Applicant: CHANGXIN MEMORY TECHNOLOGIES, INC., Hefei (CN)

(72) Inventor: Xiaofei Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/449,667

(22) Filed: Sep. 30, 2021

(65) Prior Publication Data

US 2022/0052698 A1 Feb. 17, 2022

Related U.S. Application Data

(63) Continuation of application No. PCT/CN2021/076171, filed on Feb. 9, 2021.

(30) Foreign Application Priority Data

Aug. 11, 2020 (CN) .......................... 202010799413.6

(51) Int. Cl.
*H03L 7/081* (2006.01)
*G11C 11/4076* (2006.01)

(52) U.S. Cl.
CPC ........ *H03L 7/0814* (2013.01); *G11C 11/4076* (2013.01); *H03L 7/0816* (2013.01)

(58) Field of Classification Search
CPC .. H03L 7/0814; H03L 7/0816; G11C 11/4076
USPC .................................. 327/147–149, 156–158
See application file for complete search history.

(56) References Cited

U.S. PATENT DOCUMENTS

| | | | | |
|---|---|---|---|---|
| 5,566,204 A | * | 10/1996 | Kardontchik | H03L 7/07 375/360 |
| 7,119,596 B2 | * | 10/2006 | Kong | H03K 5/133 327/158 |
| 8,112,656 B1 | * | 2/2012 | Chandra | G06F 1/10 713/400 |
| 8,139,700 B2 | * | 3/2012 | Beukema | H03K 5/15013 327/147 |
| 8,378,738 B1 | * | 2/2013 | Zhu | G06F 1/3296 327/158 |

(Continued)

FOREIGN PATENT DOCUMENTS

| | | |
|---|---|---|
| CN | 203340049 U | 12/2013 |
| CN | 108306639 A | 7/2018 |
| CN | 109903794 A | 6/2019 |

OTHER PUBLICATIONS

International Search Report in Application No. PCT/CN2021/076171, dated May 19, 2021.

*Primary Examiner* — Adam D Houston
(74) *Attorney, Agent, or Firm* — Syncoda LLC; Feng Ma

(57) ABSTRACT

A delay locked loop circuit includes: a variable delay line configured to delay an initial clock signal to generate a delayed clock signal; and a control circuit connected to the variable delay line, configured to control the variable delay line to perform delay adjustment of a first mode and further configured to perform delay adjustment of a second mode on the variable delay line when the delayed clock signal satisfies a preset condition. A step value of each delay adjustment of the first mode is a first step value, a step value of each delay adjustment of the second mode is a second step value, and the second step value is greater than the first step value.

9 Claims, 5 Drawing Sheets

(56) References Cited

U.S. PATENT DOCUMENTS

| | | | | |
|---|---|---|---|---|
| 9,401,724 B1* | 7/2016 | Gao | ................... | H03B 5/1243 |
| 9,577,649 B1* | 2/2017 | Liong | ................... | H03L 7/0818 |
| 10,698,432 B2* | 6/2020 | Shih | ................... | G05F 1/46 |
| 11,139,019 B1* | 10/2021 | Satoh | ................... | G11C 7/222 |
| 2003/0052997 A1* | 3/2003 | Renner | ................... | H04N 5/126 |
| | | | | 348/E9.039 |
| 2004/0091075 A1* | 5/2004 | Bhullar | ................... | H03L 7/093 |
| | | | | 375/375 |
| 2005/0024105 A1* | 2/2005 | Agrawal | ................... | H03L 7/0995 |
| | | | | 327/156 |
| 2007/0194825 A1* | 8/2007 | Song | ................... | H03L 7/089 |
| | | | | 327/158 |
| 2008/0001639 A1* | 1/2008 | Rajashekhar | ................... | G11C 7/222 |
| | | | | 327/161 |
| 2009/0273381 A1 | 11/2009 | Kim et al. | | |
| 2010/0039148 A1* | 2/2010 | Petrie | ................... | H03L 7/0818 |
| | | | | 327/149 |
| 2010/0225402 A1* | 9/2010 | Yang | ................... | H03L 1/022 |
| | | | | 331/10 |
| 2011/0075781 A1* | 3/2011 | Kenney | ................... | H03L 7/235 |
| | | | | 375/376 |
| 2013/0121094 A1 | 5/2013 | Zerbe et al. | | |
| 2014/0021990 A1* | 1/2014 | Na | ................... | H03L 7/0818 |
| | | | | 327/158 |
| 2014/0354335 A1* | 12/2014 | Syllaios | ................... | H03L 7/193 |
| | | | | 327/157 |
| 2014/0354336 A1* | 12/2014 | Syllaios | ................... | H03L 7/193 |
| | | | | 327/156 |
| 2015/0341021 A1* | 11/2015 | Ma | ................... | H03K 5/1565 |
| | | | | 327/175 |
| 2016/0065225 A1* | 3/2016 | Pavao-Moreira | ................... | H03L 7/099 |
| | | | | 331/16 |
| 2016/0072514 A1* | 3/2016 | Tsai | ................... | H03L 7/0995 |
| | | | | 331/47 |
| 2016/0099720 A1* | 4/2016 | Bashir | ................... | H03B 5/124 |
| | | | | 331/8 |
| 2016/0209866 A1* | 7/2016 | Jeter | ................... | G06F 1/12 |
| 2017/0093386 A1* | 3/2017 | Kitagawa | ................... | H03K 5/159 |
| 2017/0237444 A1* | 8/2017 | Wei | ................... | H03L 7/0814 |
| | | | | 327/156 |
| 2021/0217457 A1* | 7/2021 | Satoh | ................... | H03L 7/0814 |

* cited by examiner

DELAY LOCKED LOOP CIRCUIT

CROSS-REFERENCE TO RELATED APPLICATIONS

This is a continuation of International Patent Application No. PCT/CN2021/076171 filed on Feb. 9, 2021, which claims priority to Chinese Patent Application No. 202010799413.6 filed on Aug. 11, 2020. The above-referenced applications are hereby incorporated by reference in their entirety.

BACKGROUND

With the continuous development of sciences and technologies, a double data rate (DDR) dynamic random-access memory (DRAM) is widely used in a variety of electronic devices, such as computers, mobile phones and tablet computers. A DQS signal is needed to realize signal synchronization between the memory and a controller when the DRAM performs data read and write operations. Specifically, if data is read from the memory, the controller determines, based on the DQS signal from the memory, when to receive the read data.

SUMMARY

The present disclosure relates generally to the field of semiconductor integrated circuit technologies, and more specifically to a delay locked loop circuit.

Various embodiments of the present disclosure provide a delay locked loop circuit.

A delay locked loop circuit, including:

a variable delay line configured to delay an initial clock signal to generate a delayed clock signal; and a control circuit connected to the variable delay line, configured to control the variable delay line to perform delay adjustment of a first mode and further configured to perform delay adjustment of a second mode on the variable delay line when the delayed clock signal satisfies a preset condition;

wherein a step value of each delay adjustment of the first mode is a first step value, a step value of each delay adjustment of the second mode is a second step value, and the second step value is greater than the first step value.

Details of one or more embodiments of the present disclosure are set forth in the following accompanying drawings and descriptions. Other features, objectives and advantages of the present disclosure become obvious with reference to the specification, the accompanying drawings, and the claims.

BRIEF DESCRIPTION OF THE DRAWINGS

In order to better describe and illustrate embodiments of the present disclosure, reference may be made to one or more accompanying drawings. Additional details or examples used to describe the accompanying drawings should not be considered as limitations on the scope of any of the invention-creations, the embodiments described hereinafter, and the preferred embodiments of the present disclosure.

DETAILED DESCRIPTION

Figure 1:
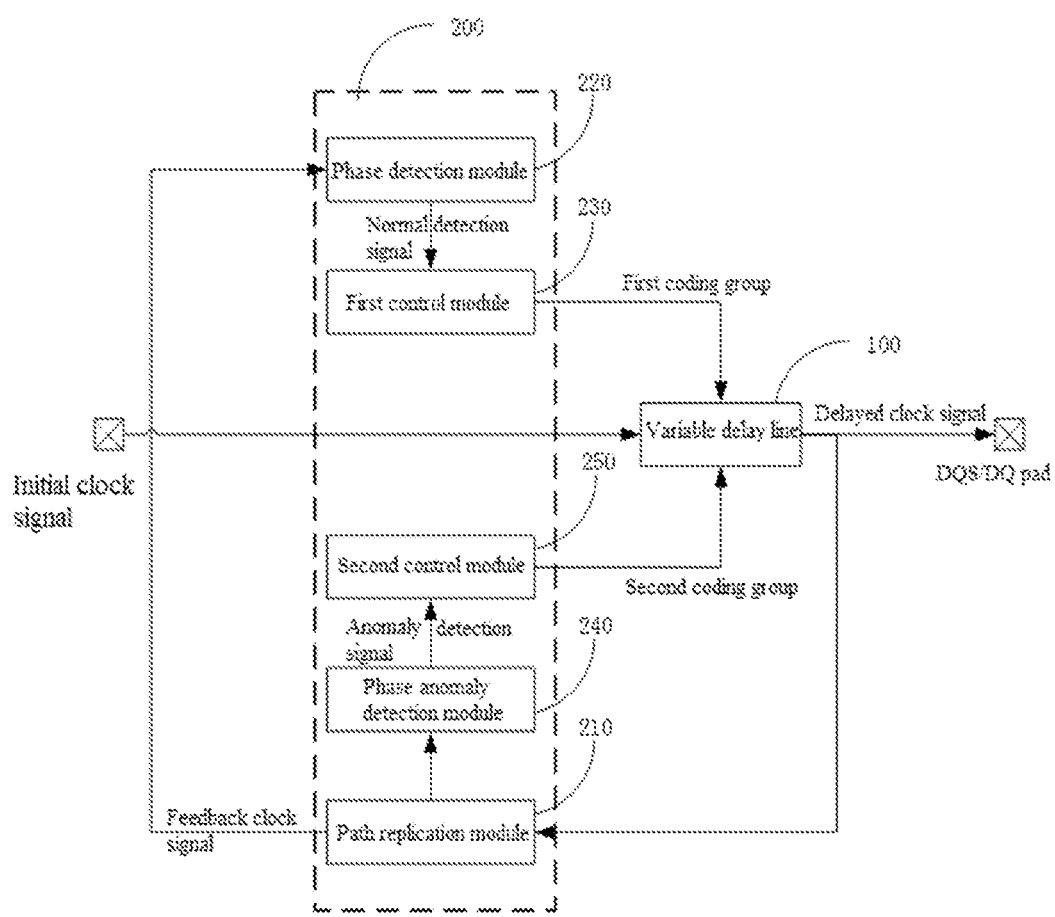
FIG. 1 is a schematic structural diagram of a delay locked loop circuit according to an embodiment.

For easy understanding of the present disclosure, a more comprehensive description of the present disclosure will be given below with reference to the relevant accompanying drawings. Preferred embodiments of the present disclosure are given in the drawings. However, the present disclosure may be implemented in many different forms and is not limited to the embodiments described herein. Rather, these embodiments are provided to make the contents disclosed in the present disclosure more thorough and comprehensive.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure. The term "and/or" used herein includes any and all combinations of one or more related listed items.

In the description of the present disclosure, it should be understood that the orientation or position relationship indicated by the terms "upper", "lower", "vertical", "horizontal", "inner", "outer", etc. are based on the orientation or position relationship shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In a prior art, in order to achieve accurate data reading, a clock signal and a DQS signal of a controller are required to be aligned on rising edges to ensure correct data. However, during the operation of a memory, a voltage of the memory may change due to a current change and other reasons, and a phase of the DQS signal may drift with a voltage fluctuation, which leads to phase mismatch between the clock signal and a drifting DQS signal, resulting in a data reading error and affecting the operational reliability of the memory.

FIG. 1 is a schematic structural diagram of a delay locked loop circuit according to an embodiment. Referring to FIG. 1, in this embodiment, the delay locked loop circuit includes a variable delay line 100 and a control circuit 200.

The variable delay line 100 is configured to delay an initial clock signal CK to generate a delayed clock signal.

The variable delay line 100 is a circuit that adjusts a phase of an input signal in a stepped manner and outputs an adjusted signal. Specifically, adjusting in a stepped manner means using a step value as a minimum adjustment unit; that is, the input signal is adjusted with one step value at a time to generate an output signal. In this embodiment, the variable delay line 100 is configured to delay the initial clock signal CK; that is, a phase difference between the delayed clock signal and the initial clock signal CK is the one step value.

It may be understood that when the memory performs data reading, a rising edge of the initial clock signal CK is required to be aligned with a rising edge of the DQS signal, so as to read data accurately. A timing sequence of the DQS signal corresponds to that of the delayed clock signal. However, the DQS signal may drift due to a voltage change. For example, the drift may change a cycle length of the DQS signal, or change a duty ratio of the DQS signal, etc., so as to change a rising edge time of the DQS signal and then lead to misalignment of the rising edge of the initial clock signal CK with the rising edge of DQS signal, resulting in a data reading error in the memory. In this embodiment, a phase of the delayed clock signal can be changed by adjusting a delay time length of the variable delay line 100, so that the rising edge of the initial clock signal CK is aligned with the rising edge of the DQS signal to improve the timing reliability.

The control circuit 200 is connected to the variable delay line 100, configured to control the variable delay line 100 to perform delay adjustment of a first mode and further configured to perform delay adjustment of a second mode on the variable delay line 100 when the delayed clock signal satisfies a preset condition; wherein a step value of each delay adjustment of the first mode is a first step value, a step value of each delay adjustment of the second mode is a second step value, and the second step value is greater than the first step value.

It may be understood that a signal can be adjusted faster with a greater step value. However, if a phase error of the signal is small, the adjustment on the signal with the greater step value easily leads to instability of the signal. Therefore, an appropriate step value is required to be selected according to an actual state of the signal to achieve more accurate adjustment.

Specifically, the delayed clock signal satisfying a preset condition may refer to a timing relationship between the delayed clock signal and the initial clock signal CK satisfying a set condition. The set condition may be, for example, a time difference between a rising edge of the delayed clock signal and a rising edge of the initial clock signal CK being greater than a threshold range, or a difference between a cycle of the delayed clock signal and a cycle of the initial clock signal CK being greater than a threshold range, or a difference between a duty ratio of the delayed clock signal and a duty ratio of the initial clock signal CK being greater than a threshold range. It should be noted that the above examples are only intended for illustration and are not intended to limit the protection scope of the present disclosure. Other parameters that can be used to reflect the timing relationship between the delayed clock signal and the initial clock signal CK also fall within the protection scope of the present disclosure. In this embodiment, with the setting of the preset condition for the delayed clock signal, a delay of the variable delay line 100 can be accurately adjusted based on a state of the delayed clock signal, so as to improve delay accuracy of the delay locked loop circuit, thereby realizing more accurate and faster match between the DQS signal and the initial clock signal CK.

In this embodiment, the delay locked loop circuit includes: a variable delay line 100 configured to delay an initial clock signal CK to generate a delayed clock signal; and a control circuit 200 connected to the variable delay line 100, configured to control the variable delay line 100 to perform delay adjustment of a first mode and further configured to perform delay adjustment of a second mode on the variable delay line 100 when the delayed clock signal satisfies a preset condition; wherein a step value of each delay adjustment of the first mode is the first step value, a step value of each delay adjustment of the second mode is the second step value, and the second step value is greater than the first step value. An actual state of the delayed clock signal can be obtained by judging whether the delayed clock signal satisfies the preset condition, so as to adjust the delay of the variable delay line 100 with different strategies, that is, make delay adjustment with different step values, so that an output of the delay locked loop circuit can dynamically and adaptively track timing changes in the delayed clock signal, thereby realizing faster and more flexible timing adjustment on the delayed clock signal, which improves a match degree between the initial clock signal CK and the drifting DQS signal and effectively avoids a data reading error.

Further, the first step value and the second step value are directly correlated with an operation rate of the memory. Furthermore, the first step value and the second step value are reversely correlated with the operation rate of the memory; that is, the faster the operation rate of the memory, the smaller the first step value and the second step value. For example, if an LPDDR4 is at a data transmission rate of 3200 Mbps and an LPDDR4X is at a data transmission rate of 4.266 Gbps, a first step value for the LPDDR4X is less than that for the LPDDR4 accordingly, and a second step value for the LPDDR4X is also less than that for the LPDDR4 accordingly. That is, the first step value and the second step value are positively correlated with a cycle of a DQS signal to be matched. Illustratively, if a cycle of a DQS signal of the LPDDR4 is T1 and a cycle of a DQS signal of the LPDDR4X is T2, a ratio of the first step value for the LPDDR4 to the first step value for the LPDDR4X may be T1/T2, so as to appropriately adjust the delay of the variable delay line 100 to align the rising edge of the initial clock signal CK with the rising edge of the DQS signal.

In one embodiment, the control circuit 200 includes a path replication module 210, a phase detection module 220 and a first control module 230.

The path replication module 210 is configured to receive the delayed clock signal and delay the delayed clock signal for a preset time to generate a feedback clock signal CKFB.

Specifically, the path replication module 210 is connected to an output terminal of the variable delay line 100. The path replication module 210 is configured with a preset path length. The preset path length is the same as a path length from the output terminal of the variable delay line 100 to a DQS/DQ pad, and the preset path length is directly proportional to the preset time. A ratio of both is a transmission speed of a signal on a preset path. The path replication module 210 is configured to receive the delayed clock signal and generate the feedback clock signal CKFB based on the delayed clock signal and the preset path length; that is, a delay for the preset time is applied to the delayed clock signal to generate the feedback clock signal CKFB. It may be understood that, since the delayed clock signal corresponds to the DQS signal and the path replication module 210 can accurately match the time from the variable delay line 100 to the DQS/DQ pad, the feedback clock signal CKFB can accurately feedback a timing sequence of the DQS signal. Therefore, a timing relationship between the initial clock signal CK and the DQS signal can be obtained by comparing a timing relationship between the initial clock signal CK and the feedback clock signal CKFB.

The phase detection module 220 is connected to the path replication module 210 and configured to detect a phase difference between the feedback clock signal CKFB and the initial clock signal CK and generate a normal detection signal according to the phase difference.

The first control module 230 is connected to the phase detection module 220 and configured to generate a first coding group based on the normal detection signal. The first coding group is configured to adjust a delay of the variable delay line 100, and the step value of the delay adjustment corresponding to a least significant bit of the first coding group is the first step value.

The variable delay line 100 may include a plurality of delay units. Each delay unit is configured to generate a delay of a set step size. The first coding group includes a plurality of control code bits in one-to-one correspondence to the delay units. Illustratively, the variable delay line 100 includes eight delay units. The first coding group includes eight control code bits. When a value of the first coding group is 10000000, a first delay unit is turned on and other delay units are turned off to produce one delay of the set step size. When the value of the first coding group is 10000001, the first delay unit and an eighth delay unit are controlled to be turned on, and other delay units are turned off, to produce two steps of the set step size. Therefore, the variable delay line 100 can be controlled by changing the value of the first coding group. It should be noted that the above examples are intended only for illustration and are not intended to specifically limit the variable delay line 100 and the first coding group.

Specifically, the normal detection signal generated by the phase detection module 220 is configured to indicate the first control module 230. The first control module 230 generates the first coding group under the indication of the normal detection signal. The first coding group adjusts the delay of the variable delay line 100 correspondingly. Illustratively, when the normal detection signal is at a high level, it indicates that the phase difference between the feedback clock signal CKFB and the initial clock signal CK is greater than a phase difference threshold of the phase detection module 220 and adjustment on a timing sequence of the delayed clock signal is required, so as to reduce the phase difference between the feedback clock signal CKFB and the initial clock signal CK. After receiving the normal detection signal at the high level, the first control module 230 adjusts the value of the first coding group, so as to change the delay time length of the variable delay line 100. When the normal detection signal is at a low level, it indicates that the phase difference between the feedback clock signal CKFB and the initial clock signal CK is less than the phase difference threshold of the phase detection module 220 and the adjustment on the timing sequence of the delayed clock signal is not necessary. After receiving the normal detection signal at the low level, the first control module 230 maintains the value of the first coding group unchanged, so as to maintain a timing state of the delayed clock signal.

In one embodiment, still referring to FIG. 1, the control circuit 200 further includes a phase anomaly detection module 240 and a second control module 250.

The phase anomaly detection module 240 is connected to the path replication module 210 and configured to detect the phase difference between the feedback clock signal CKFB and the initial clock signal CK and generate an anomaly detection signal PE according to the phase difference.

The second control module 250 is connected to the phase anomaly detection module 240 and configured to generate a second coding group based on the anomaly detection signal PE. The second coding group is configured to adjust the delay of the variable delay line 100, and the step value of the delay adjustment corresponding to a least significant bit of the second coding group is the second step value.

Control manners of the phase anomaly detection module 240 and the second control module 250 are the same as those of the phase detection module 220 and the first control module 230 described above. It may be understood that during normal operation of the memory, disturbance factors such as an external temperature have little influence on the timing sequence of the DQS signal. Therefore, the rising edge of the initial clock signal CK and the rising edge of the DQS signal can be aligned only by adjustment with the first step value. However, when a voltage of the memory changes, the DQS signal may be affected greatly, thereby leading to an abnormal change in the rising edge time of the DQS signal. The phase anomaly detection module 240 is configured to detect the abnormal change, and when the abnormal change changes, to enable, through the anomaly detection signal PE, the second control module 250 to control the delay of the variable delay line 100 to be adjusted with the second step value, so as to rapidly correct the abnormal DQS signal.

Specifically, the phase anomaly detection module 240 is configured to determine that the delayed clock signal satisfies the preset condition when the phase difference between the feedback clock signal CKFB and the initial clock signal CK is greater than or equal to a phase difference threshold and to switch the anomaly detection signal PE to a first state. The anomaly detection signal PE in the first state is configured to control the second coding group to be valid. The first state may be a high level. When the second coding group is valid, the delay of the variable delay line 100 can be controlled to be adjusted with the second step value. The phase anomaly detection module 240 is further configured to determine that the delayed clock signal does not satisfy the preset condition when the phase difference between the feedback clock signal CKFB and the initial clock signal CK is less than or equal to the phase difference threshold and to switch the anomaly detection signal PE to a second state. The anomaly detection signal PE in the second state is configured to control the second coding group to be invalid. The second state may be a low level.

In one embodiment, the phase anomaly detection module 240 is further configured to determine an anomaly level of the phase difference. The second control module 250 is further configured to receive the anomaly level and adjust the second step value according to the anomaly level. The anomaly level is determined by the phase difference between the initial clock signal CK and the feedback clock signal CKFB. Specifically, the anomaly level is determined by a range of a phase difference threshold of the phase difference between the initial clock signal CK and the feedback clock signal CKFB. Illustratively, the anomaly level may include four levels, that is, levels 0 to 3. Moreover, phase differences from the anomaly level 0 to the anomaly level 3 sequentially increase, and correspondingly, have a first phase difference threshold td0, a second phase difference threshold td1, a third phase difference threshold td2 and a fourth phase difference threshold td3 respectively. The phase difference thresholds are in a relationship of td0<td1<td2<td3. For example, if the phase difference is between the first phase difference threshold td0 and the second phase difference threshold td1, the anomaly level may be determined as 0. If the phase difference is between the second phase difference threshold td1 and the third phase difference threshold td2, the anomaly level may be determined as 1. If the phase difference is between the third phase difference threshold td2 and the fourth phase difference threshold td3, the anomaly level may be determined as 2. If the phase difference is greater than the fourth phase difference threshold td3, the anomaly level may be determined as 3.

Figure 2:
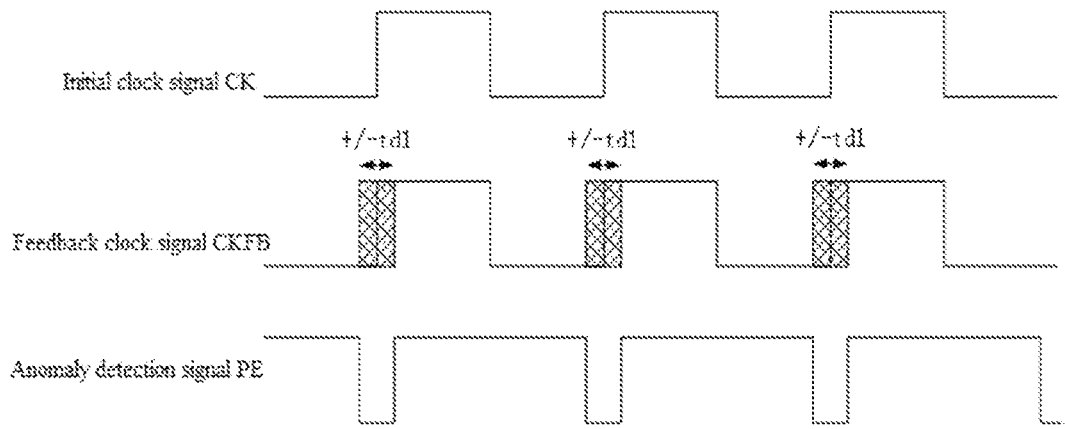
FIG. 2 is a schematic timing sequence diagram of a second phase difference threshold according to an embodiment.
Figure 3:
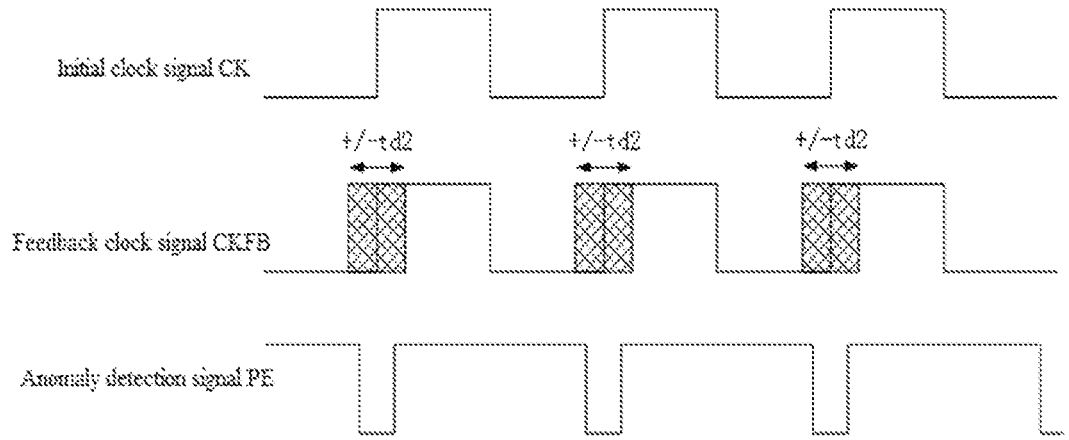
FIG. 3 is a schematic timing sequence diagram of a third phase difference threshold according to an embodiment.

FIG. 2 is a schematic timing sequence diagram of a second phase difference threshold according to an embodiment, and FIG. 3 is a schematic timing sequence diagram of a third phase difference threshold according to an embodiment. Referring to FIG. 2, when a rising edge time of the feedback clock signal CKFB is within a range of +/−td1 of a rising edge time of the initial clock signal CK, it indicates that the phase difference between the feedback clock signal CKFB and the initial clock signal CK is less than or equal to the second phase difference threshold td1, and correspondingly, the anomaly detection signal PE outputs a second state, i.e., a low level, and the adjustment on the delay of the variable delay line 100 is not necessary. When the rising edge time of the feedback clock signal CKFB is outside the range of +/−td1 of the rising edge time of the initial clock signal CK, it indicates that the phase difference between the feedback clock signal CKFB and the initial clock signal CK is greater than the second phase difference threshold td1, and correspondingly, the anomaly detection signal PE outputs a first state, i.e., a high level, and the adjustment on the delay of the variable delay line 100 is needed. Referring to FIG. 2 and FIG. 3, when the phase difference threshold increases, an error window of the feedback clock signal CKFB becomes larger, that is, may correspond to a greater phase error, so as to adjust the delay of the variable delay line 100 with a greater step value. In this embodiment, with the setting of the plurality of phase difference thresholds, the phase difference is divided into abnormal levels, and the second step value is adjusted according to the abnormal levels, so as to realize more flexible delay adjustment, thereby improving adjustment precision and an adjustment speed of the delay locked loop circuit.

Figure 4:
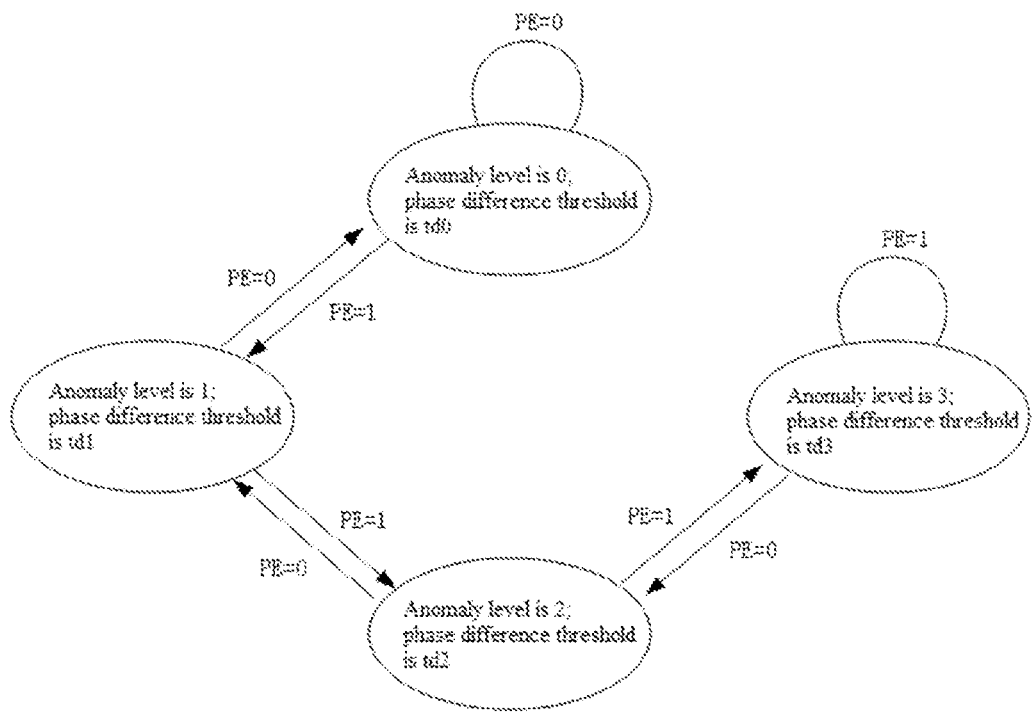
FIG. 4 shows a state machine of anomaly levels according to an embodiment.

In one embodiment, the phase anomaly detection module 240 further includes: a threshold adjusting unit. The threshold adjusting unit is configured to update the phase difference threshold based on the anomaly detection signal PE. The phase anomaly detection module 240 is configured to determine the anomaly level of the phase difference by updating the phase difference threshold. FIG. 4 shows a state machine of anomaly levels according to an embodiment. Referring to FIG. 4, the state machine adjusts the anomaly level according to a current anomaly level and a state of the anomaly detection signal PE. For example, if the current anomaly level is 2 and the phase difference between the feedback clock signal CKFB and the initial clock signal CK is detected to be less than the phase difference threshold td2, that is, the rising edge of the feedback clock signal CKFB is within an error window of the rising edge of the initial clock signal CK, it indicates that the error window can be further reduced to judge whether the anomaly level can be reduced to 1 or 0. According to this embodiment, the second step value can be more accurately adjusted by tracking the anomaly level in real time, so as to match the phase difference with the second step value to realize more accurate delay adjustment.

Figure 5:
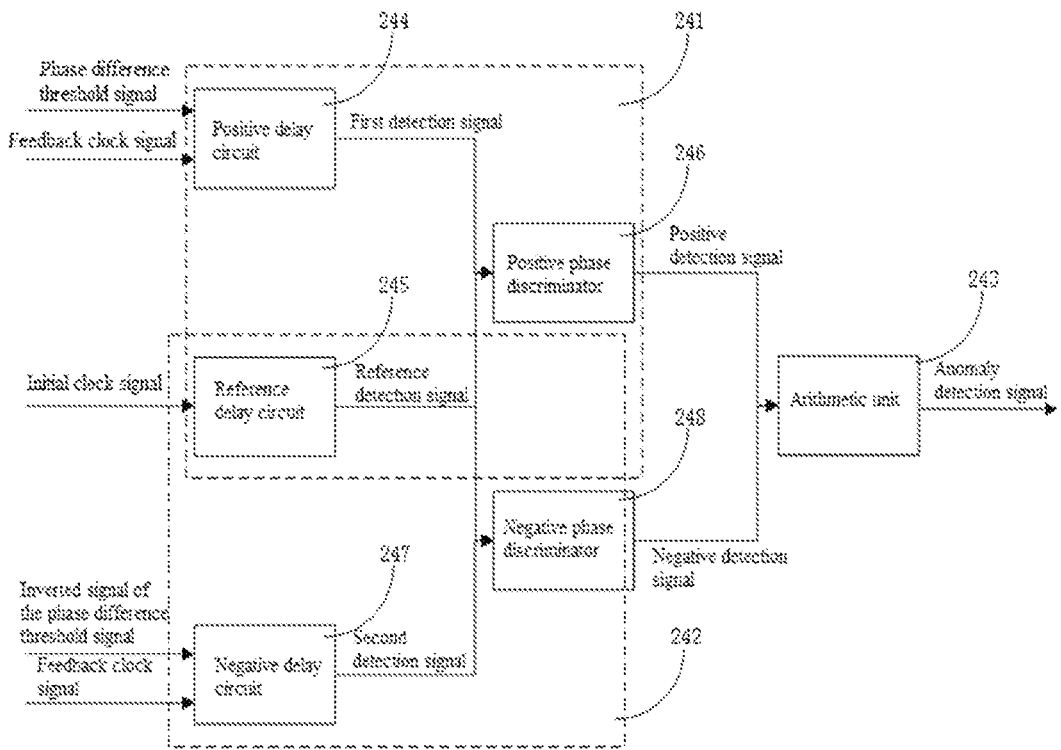
FIG. 5 is a schematic structural diagram of a phase anomaly detection module according to an embodiment.

FIG. 5 is a schematic structural diagram of the phase anomaly detection module 240 according to an embodiment. Referring to FIG. 5, the phase anomaly detection module 240 includes a positive anomaly detection unit 241, a negative anomaly detection unit 242 and an arithmetic unit 243. The positive anomaly detection unit 241 is configured to generate a positive detection signal based on the feedback clock signal CKFB, a phase difference threshold signal and the initial clock signal CK. The negative anomaly detection unit 242 is configured to generate a negative detection signal based on the feedback clock signal CKFB, an inverted signal of the phase difference threshold signal and the initial clock signal CK. The arithmetic unit 243 is configured to generate the anomaly detection signal PE based on the positive detection signal and the negative detection signal.

The positive anomaly detection unit 241 is configured to detect whether the rising edge of the feedback clock signal CKFB leads the rising edge of the initial clock signal CK and whether a leading amount is greater than the phase difference threshold, and output a high-level positive detection signal when the leading amount of the feedback clock signal CKFB is greater than the phase difference threshold. The negative anomaly detection unit 242 is configured to detect whether the rising edge of the feedback clock signal CKFB lags behind the rising edge of the initial clock signal CK and whether a lag amount is greater than the phase difference threshold, and output a high-level negative detection signal when the lag amount of the feedback clock signal CKFB is greater than the phase difference threshold. The arithmetic unit 243 is configured to generate the anomaly detection signal PE based on the positive detection signal and the negative detection signal. The arithmetic unit 243 may be a logic gate circuit, for example, an OR gate. That is, when at least one of the positive detection signal and the negative detection signal is at a high level, the anomaly detection signal PE outputted by the arithmetic unit 243 is at a high level.

In one embodiment, still referring to FIG. 5, the positive anomaly detection unit 241 includes a positive delay circuit 244, a reference delay circuit 245 and a positive phase discriminator 246. The positive delay circuit 244 is configured to generate a first detection signal based on the feedback clock signal CKFB and the phase difference threshold signal. The reference delay circuit 245 is configured to generate a reference detection signal based on the initial clock signal CK. The positive phase discriminator 246 is connected to the positive delay circuit 244 and the reference delay circuit 245 and configured to generate the positive detection signal based on the first detection signal and the reference detection signal.

The phase difference threshold signal is a signal corresponding to the phase difference threshold. Illustratively, the phase difference threshold signal may include a plurality of threshold control bits. The plurality of threshold control bits may be jointly configured to generate a delay time length, and the generated delay time length is equal to the phase difference threshold. Specifically, the first detection signal is a signal generated after the feedback clock signal CKFB is delayed by the phase difference threshold. Compared with the processing method of first obtaining a phase difference and then determining an anomaly level, the method for generating the first detection signal according to this embodiment can be easily adjusted for different phase difference thresholds, which is more flexible and operable and can accurately obtain a phase difference between the feedback clock signal CKFB and the initial clock signal CK and an anomaly level corresponding to the phase difference by comparing phase matching between the first detection signal and the reference detection signal.

Further, the negative anomaly detection unit 242 shares the reference delay circuit 245 with the positive anomaly detection unit 241, and additionally includes a negative delay circuit 247 and a negative phase discriminator 248. A detection method of the negative anomaly detection unit 242 is similar to that of the positive anomaly detection unit 241 and is not described in detail herein.

Figure 6:
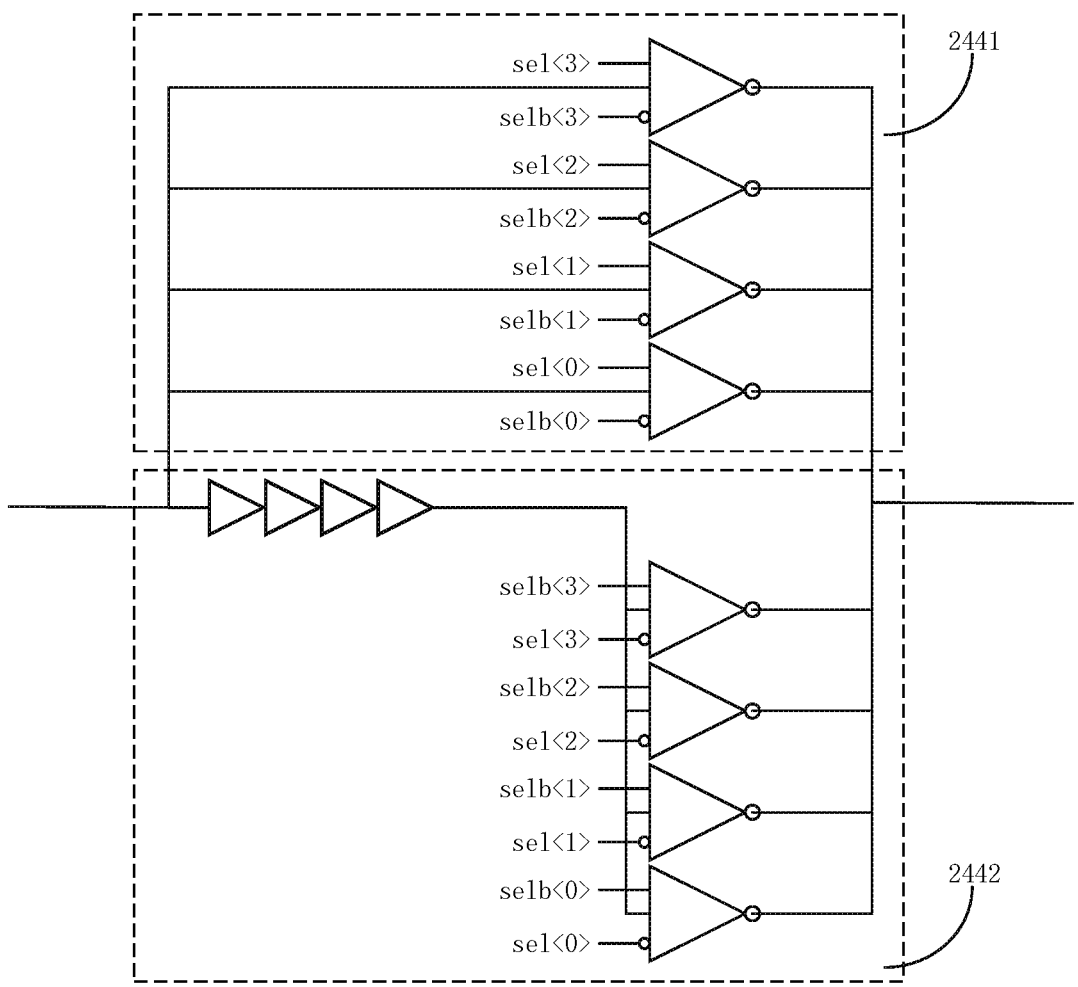
FIG. 6 is a schematic structural diagram of a positive delay circuit according to an embodiment.

FIG. 6 is a schematic structural diagram of the positive delay circuit 244 according to an embodiment. Referring to FIG. 6, in this embodiment, the positive delay circuit 244 includes a first delay circuit 2441 and a second delay circuit 2442.

The first delay circuit 2441 includes a plurality of parallel first inverters, an input terminal of the first inverter is configured to receive the feedback clock signal CKFB, and the first inverter is configured to invert an input signal under the control of the phase difference threshold. The phase difference threshold signal includes a plurality of threshold control bits in one-to-one correspondence to the phase difference thresholds.

TABLE 1

Table of phase difference threshold signals and phase difference threshold true values

| sel <3:0> | selb <3:0> | Phase difference threshold |
|---|---|---|
| 1111 | 0000 | −td3 |
| 1101 | 0010 | −td2 |
| 1011 | 0100 | −td1 |
| 1001 | 0110 | −td0 |
| 1000 | 0111 | 0 |
| 0101 | 1010 | td0 |
| 0011 | 1100 | td1 |
| 0010 | 1101 | td2 |
| 0000 | 1111 | td3 |

Table 1 is a table of phase difference threshold signals and phase difference threshold true values. Referring to Table 1, in this embodiment, the phase difference threshold signal includes four threshold control bits. Each bit of data is correspondingly sel <3:0>. selb <3:0> is an inversion of sel <3:0>. Illustratively, if the phase difference threshold signal is 0101, sel0=1, sel1=0, sel2=1, sel3=0, selb0=0, selb1=1, selb2=0, selb3=1, and sel <3:0> and selb <3:0> are inputted to the first inverter in pairs, so as to serve as an enable signal to control output of each first inverter.

The second delay circuit 2442 includes a fixed delay chain and a plurality of second inverters. The fixed delay chain is configured to receive the feedback clock signal CKFB and perform a preset delay on the feedback clock signal CKFB to generate a delay feedback signal. In this embodiment, the fixed delay chain includes four buffers. Input terminals of the plurality of parallel second inverters are configured to receive the delay feedback signal. The second inverter is configured to invert the input signal under the control of the phase difference threshold. A manner of inputting the enable signal of the second inverter is similar to that of the first inverter and is not described in detail herein. Outputs of the first delay circuit 2441 and the second delay circuit 2442 constitute the first detection signal. That is, the first detection signal is generated based on the feedback clock signal CKFB and the phase difference threshold signal.

Figure 7:
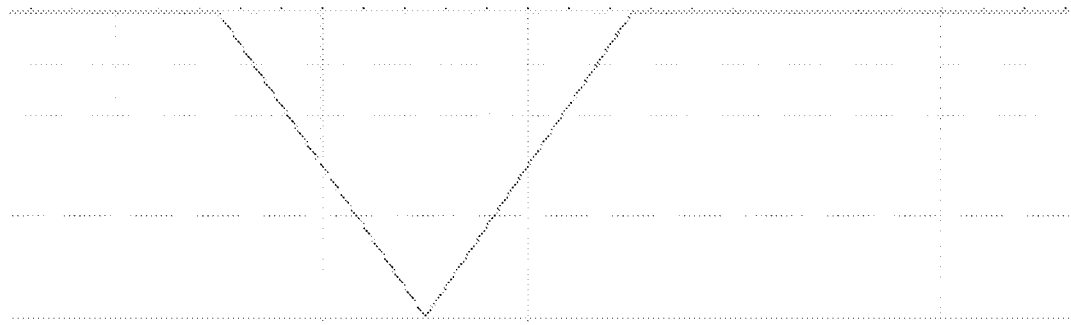
FIG. 7 is a simulation diagram of voltage fluctuations according to an embodiment.
Figure 8:
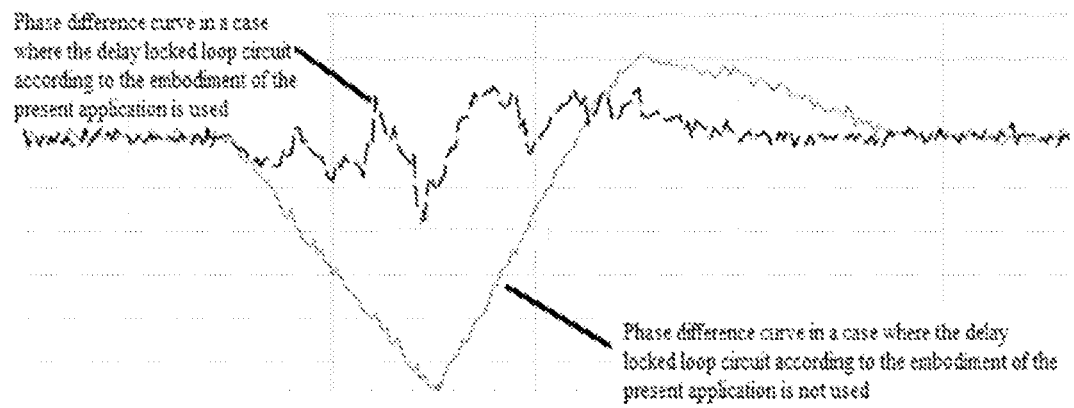
FIG. 8 is a simulation diagram of phase differences in the case of voltage fluctuations in the embodiment of FIG. 7.

FIG. 7 is a simulation diagram of voltage fluctuations according to an embodiment, and FIG. 8 is a simulation diagram of phase differences in the case of voltage fluctuations in the embodiment of FIG. 7. In FIG. 8, the dotted line represents a phase difference curve in a case where the delay locked loop circuit according to the embodiment of the present disclosure is not used, and the solid line represents a phase difference curve in a case where the delay locked loop circuit according to the embodiment of the present disclosure is used. Referring to FIG. 7 to FIG. 8, in order to verify the performance of the delay locked loop circuit, a 60-mV voltage ramp signal as shown in FIG. 7 is applied to simulate voltage fluctuations, and the delay locked loop circuit is turned on and off to check for signal phase error changes. As shown in FIG. 8, after the delay locked loop circuit according to the embodiment of the present disclosure is used, a phase peak drift of the DQS signal is reduced by about 70%, thereby greatly improving the stability and reliability.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A delay locked loop circuit, comprising:
   a variable delay line configured to delay an initial clock signal to generate a delayed clock signal; and
   a control circuit connected to the variable delay line, configured to control the variable delay line to perform delay adjustment of a first mode and further configured to perform delay adjustment of a second mode on the variable delay line when the delayed clock signal satisfies a preset condition;
   wherein a step value of each delay adjustment of the first mode is a first step value, a step value of each delay adjustment of the second mode is a second step value, and the second step value is greater than the first step value; and
   wherein the control circuit comprises:
   a path replication module configured to receive the delayed clock signal and delay the delayed clock signal for a preset time to generate a feedback clock signal;
   a phase detection module configured to detect a phase difference between the feedback clock signal and the initial clock signal and generate a normal detection signal according to the phase difference; and
   a first control module connected to the phase detection module and configured to generate a first coding group based on the normal detection signal, the first coding group being configured to adjust a delay of the variable delay line, and the step value of the delay adjustment corresponding to a least significant bit of the first coding group being the first step value.

2. The delay locked loop circuit according to claim 1, wherein the control circuit further comprises:
   a phase anomaly detection module configured to detect the phase difference between the feedback clock signal and the initial clock signal and generate an anomaly detection signal according to the phase difference; and
   a second control module connected to the phase anomaly detection module and configured to generate a second coding group based on the anomaly detection signal, the second coding group being configured to adjust the delay of the variable delay line, and the step value of the delay adjustment corresponding to a least significant bit of the second coding group being the second step value.

3. The delay locked loop circuit according to claim 2, wherein the phase anomaly detection module is configured to determine that the delayed clock signal satisfies the preset condition when the phase difference between the feedback clock signal and the initial clock signal is greater than or equal to a phase difference threshold and to switch the anomaly detection signal to a first state, the anomaly detection signal in the first state being configured to control the second coding group to be valid.

4. The delay locked loop circuit according to claim 3, wherein the phase anomaly detection module is further configured to determine that the delayed clock signal does not satisfy the preset condition when the phase difference between the feedback clock signal and the initial clock signal is less than or equal to the phase difference threshold and to switch the anomaly detection signal to a second state, the anomaly detection signal in the second state being configured to control the second coding group to be invalid.

5. The delay locked loop circuit according to claim 2, wherein the phase anomaly detection module comprises:
 a positive anomaly detection unit configured to generate a positive detection signal based on the feedback clock signal, a phase difference threshold signal and the initial clock signal;
 a negative anomaly detection unit configured to generate a negative detection signal based on the feedback clock signal, an inverted signal of the phase difference threshold signal and the initial clock signal; and
 an arithmetic unit configured to generate the anomaly detection signal based on the positive detection signal and the negative detection signal.

6. The delay locked loop circuit according to claim 5, wherein the phase anomaly detection module is further configured to determine an anomaly level of the phase difference; and
 the second control module is further configured to receive the anomaly level and adjust the second step value according to the anomaly level.

7. The delay locked loop circuit according to claim 6, wherein the phase anomaly detection module further comprises: a threshold adjusting unit configured to update the phase difference threshold based on the anomaly detection signal; and
 the phase anomaly detection module is configured to determine the anomaly level of the phase difference by updating the phase difference threshold.

8. The delay locked loop circuit according to claim 5, wherein the positive anomaly detection unit comprises:
 a positive delay circuit configured to generate a first detection signal based on the feedback clock signal and the phase difference threshold signal;
 a reference delay circuit configured to generate a reference detection signal based on the initial clock signal; and
 a positive phase discriminator connected to the positive delay circuit and the reference delay circuit and configured to generate the positive detection signal based on the first detection signal and the reference detection signal.

9. The delay locked loop circuit according to claim 8, wherein the positive delay circuit comprises:
 a first delay circuit comprising a plurality of parallel first inverters, an input terminal of the first inverter being configured to receive the feedback clock signal, and the first inverter being configured to invert an input signal under the control of the phase difference threshold; and
 a second delay circuit comprising:
 a fixed delay chain configured to receive the feedback clock signal and perform a preset delay on the feedback clock signal to generate a delay feedback signal; and
 a plurality of parallel second inverters, an input terminal of the second inverter being configured to receive the delay feedback signal, and the second inverter being configured to invert the input signal under the control of the phase difference threshold;
 wherein outputs of the first delay circuit and the second delay circuit constitute the first detection signal.

* * * * *